United States Patent
Honeycutt et al.

(10) Patent No.: US 6,320,121 B1
(45) Date of Patent: Nov. 20, 2001

(54) RADIO FREQUENCY SHIELD CAN COVER WITH INTERNAL FINGERS

(75) Inventors: Robert M. Honeycutt, Morristown; Michael G. Kossor, Kenilworth; Richard G. Witty, Kinnelon, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/395,131

(22) Filed: Sep. 14, 1999

(51) Int. Cl.[7] .................................................. H05K 9/00
(52) U.S. Cl. .......................... 174/35 R; 361/752; 361/816
(58) Field of Search ............................. 174/35 R, 35 GC; 361/816, 818, 753, 799, 800, 752

(56) References Cited

U.S. PATENT DOCUMENTS

| | | | |
|---|---|---|---|
| 3,816,911 | * 6/1974 | Knappenberger | 29/626 |
| 4,384,165 | * 5/1983 | Loving, Jr. et al. | 174/35 GC |
| 5,095,177 | * 3/1992 | Johnson | 174/35 R |
| 5,365,410 | 11/1994 | Lonka et al. | 361/816 |
| 5,614,694 | 3/1997 | Gorenz, Jr. et al. | 174/35 R |
| 5,687,470 | 11/1997 | Halttunen et al. | 29/592.1 |

* cited by examiner

Primary Examiner—Dean A. Reichard
Assistant Examiner—Hung V Ngo
(74) Attorney, Agent, or Firm—Gibbons, Del Deo, Dolan, Griffinger & Vecchione (57) ABSTRACT

A removable RF shield cover that snap-fit attaches to RF shield fence walls without special tools or soldering. The RF shield cover engage the interior surface of the shield wall with a tensional force that holds the RF shield cover and provides for a continuous metal-to-metal seal to isolate electronic components to reduce RF emissions or protect against electo-magnetic interference. The snap-fit attachment enables the RF shield cover to be easily removed from the fence, without special tools, to access components within the RF shield enclosure.

20 Claims, 7 Drawing Sheets

RADIO FREQUENCY SHIELD CAN COVER WITH INTERNAL FINGERS

RELATED APPLICATIONS

The present invention is related to U.S. patent application Ser. No. 09/396,921, filed concurrently herewith, entitled RADIO FREQUENCY SHIELD COVER WITH INTERLOCKING FINGERS, which is assigned to the same assignee and is incorporated by reference herein.

FIELD OF THE INVENTION

This invention is related to Radio Frequency (RF) shielding to reduce Electro-Magnetic Interference (EMI) caused by RF emissions. In particular the claimed invention simplifies the attachment of an RF shield cover onto an RF shield fence.

BACKGROUND OF THE INVENTION

RF circuits are well known in the art to produce, amplify and modulate radio frequency energy. RF energy radiating from the RF circuits is also known to increase the noise level that, in turn, affects the operation of adjacent electronic circuits. For example, the operation of adjacent electronic circuits becomes erratic and unpredictable as the RF energy, and the resultant noise level, ebbs and flows from the RF circuits. This RF interference, also known as electromagnetic interference (EMI), is an extremely important factor in determining the proper performance and functionality of electronic circuits adjacent to RF circuits. Accordingly, it is necessary to confine radiating RF energy to protect sensitive electronic components and prevent significant RF energy from radiating from a product.

One method to protect sensitive components from RF interference is to place RF shields around critical electronic components. An RF shield is a continuous conductive structure that surrounds and encloses components to prevent RF radiation from entering, leaving, or passing through the shield. Metallic RF shields, commonly referred to as 'shield cans," that separate RF circuits from one another and provide isolation between signal paths are well known in the art. RF shields are generally constructed in two parts—i.e., a thin continuous metallic wall that surrounds the circuitry and a cover that extends over the RF circuitry and attaches to the continuous metallic wall. The shield wall, commonly referred to as a fence, is typically soldered to a printed circuit board, or printed wiring board (PWB), and connected to the electrical ground of the board. In one implementation, the cover is held attached to the fence with copper tape. The copper tape retains the cover to the fence and prevents RF leakage as it seals any gap between the fence and the cover. This process, however, is both expensive and labor intensive.

In another implementation the cover is soldered to the fence creating a uniform seal around the RF circuitry, and insuring electrical contact with the electrical ground. Soldered shield covers provide excellent isolation, however the soldered shield cover is extremely difficult to remove when components within the enclosure require servicing. An example of this fixed attachment is U.S. Pat. No. 5,687,470 (Method for Forming an RF Shielded Enclosure) to Halttunen, et al., which discloses attaching an RF Shield cover with a conductive adhesive paste.

Other designs known in the prior art employ a cover with an openable lid to allow for the servicing of the components within the enclosure. U.S. Pat. No. 5,614,694 (One Piece Open and Closable Metal RF Shield) to Gorenz, et al., discloses such an enclosure formed from a single piece of conductive material in which the lid is hinged to the fence and swings open at a hinged point.

Other designs are known which employ removable covers. U.S. Pat. No. 5,365,410 (Electromagnetic Compatibility Enclosure) to Lonka, discloses opening the cover with a suitable tool and soldering it back or using a replacement cover. Other designs use compressive forces to grip the outer surface of the RF fence to retain the cover in place. This compressive force may typically be created by a set of tabs or finger-like projections that employ a spring-like compressive force to grip the outer surface of the fence.

The problem encountered with removable RF shield cover designs of this type is that the RF shield cover typically requires dedicated hard tooling to stamp a specific size and pattern of the cover and fingers from a thin metal. Typically metals having a width of 0.024 inches for fences and 0.015 through 0.020 inches for covers are used. Such thin metal for the cover is necessary to insure the tabs or fingers of the cover remain flexible and remain in contact with the shield walls. Attempts to fabricate the removable RF shield cover from thicker metal, for example, 0.024 inches, have proven to be not reliable and require expensive hard tooling. The tabs or fingers of these thicker covers are not resilient enough to guarantee good electrical contact with the fence walls. The thicker fingers are also prone to bending during assembly and do not spring back sufficiently to contact the fence wall. Thus, the effectiveness of the RF suppression is compromised because adequate contact is not maintained along the entire length of the fence. RF effectiveness is also compromised as the compressive forces of the fingers also tend to deflect the thin-walled fences inward. This deflection causes gaps between the fence and cover from which RF emissions can enter or escape the enclosure.

Thus, there is a need to provide a means of attaching RF shield covers to RF fences that allow for the simple removal of the cover without special tooling while providing effective suppression of RF emissions.

SUMMARY OF THE INVENTION

The invention utilizes standard RF shield fences soldered to a PWB and a removable RF shield cover, which incorporates a unique finger design feature. The fingers on the RF shield cover engage the inside wall of the RF shield fence. This is in contrast to the methods employed by the prior art that have covers fasten to the surface of the shield wall.

This design permits the use of thicker metal for the shield cover without compromising electrical contact with the fence. The use of thicker metal also eliminates the expense of dedicated tooling to fabricate the cover from thinner materials.

A further advantage of the invention is to allow for the removal, and reuse, of the RF shield cover to effectuate repairs on the electronic components within the enclosure. By being able to remove the cover without special tooling or having to unsolder either the cover from the fence or the fence from the PWB the cost of repairing components within the enclosure is reduced.

BRIEF DESCRIPTION OF THE FIGURES

A more complete understanding of the instant invention may be obtained from consideration of the following description in conjunction with the drawings in which.

It is to be understood that these drawings are for purposes of illustrating the concepts of the invention and are not to scale. It will be appreciated that the same reference numerals, possibly supplemented with reference characters where appropriate, have been used throughout to identify corresponding parts.

DETAILED DESCRIPTION

Figure 1:
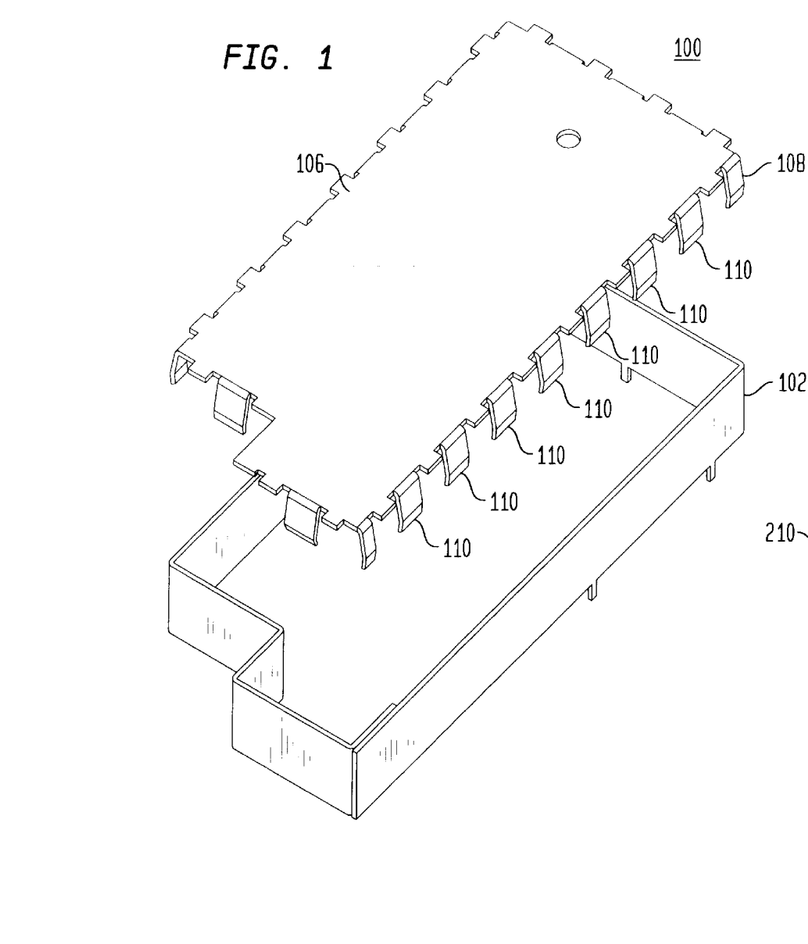
FIG. 1 is a perspective view illustrating an exemplary embodiment of an RF shield can cover with internal fingers in accordance with the invention in which the RF shield cover is vertically displaced from the RF shield fence.

The invention is directed toward an improved methodology for attaching RF shield covers to RF shield fences, which are incorporated on circuit boards. FIG. 1 illustrates an exemplary embodiment of an RF shield cover 100 disengaged from, and vertically positioned above, an RF shield fence 102. RF shield fence 102 is fixedly attached to a PWB 104 and encloses electronic components that either emit RF energy or require protection from RF energy. The RF shield cover 100 is comprised of a conductive material defining two regions, a top planar region 106 and a finger-like region 108. As shown, finger region 108 is substantially perpendicular with respect to the planar region 106. As will be understood, the height of the finger region 108 is sized according to the application. In the illustrated exemplary embodiment, finger region 108 is comprised of multiple fingers 110. Each of fingers 110, because of tension due to bending, is capable of providing a tensional force on RF shield fence 102. When positioned within fence 102, the tensional force of each finger 110 pushes against RF shield fence 102 to retain cover 100 in place. Subdividing the finger region 108 into multiple fingers 110, in the manner shown, enables each individual finger to adjust to minor deformities in shield fence 102 while maintaining a constant tensional force against shield 102.

Figure 2:
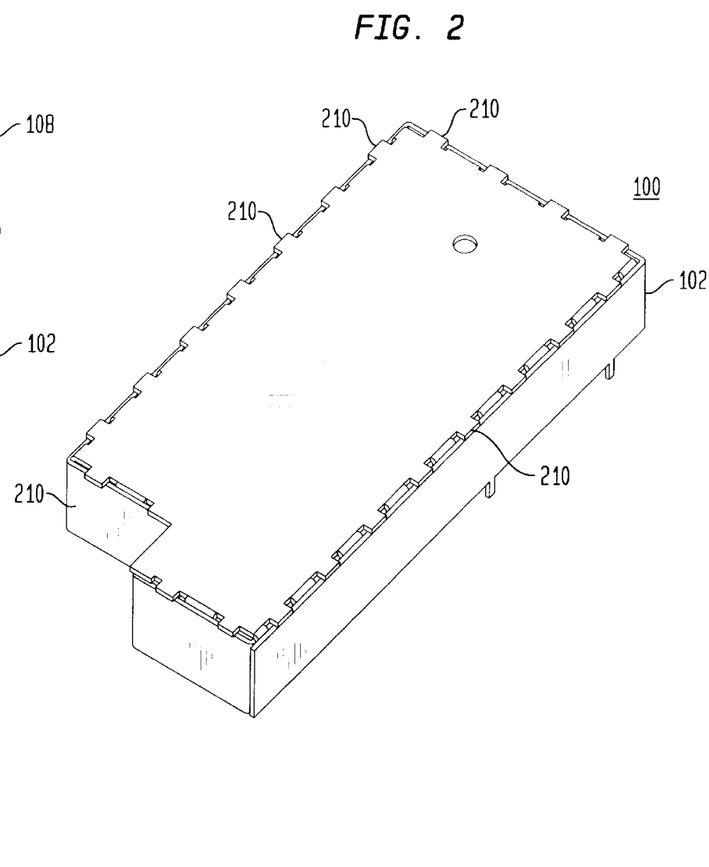
FIG. 2 is a perspective view illustrating an exemplary embodiment of an RF shield can cover with internal fingers in accordance with the invention in which the RF shield cover is engaging the RF shield fence.

Referring to FIG. 2, there is depicted an exemplary embodiment of the RF shield cover 100 where the RF shield cover 100 is installed upon RF shield fence 102. In this position, the finger region 108 of the invention securely pushes against the inner surface of RF shield fence 102 to retain RF shield cover 100 in place. Tabs 210, formed on top plate 106, rest on the top edge of fence 102 and prevent cover 100 from falling into the enclosed space by providing a positive stop. RF shield cover 100 is also in continuous engagement with RF shield fence 102 and provides an uninterrupted seal to reduce RF emissions emanating from within the enclosure.

Figure 3A:
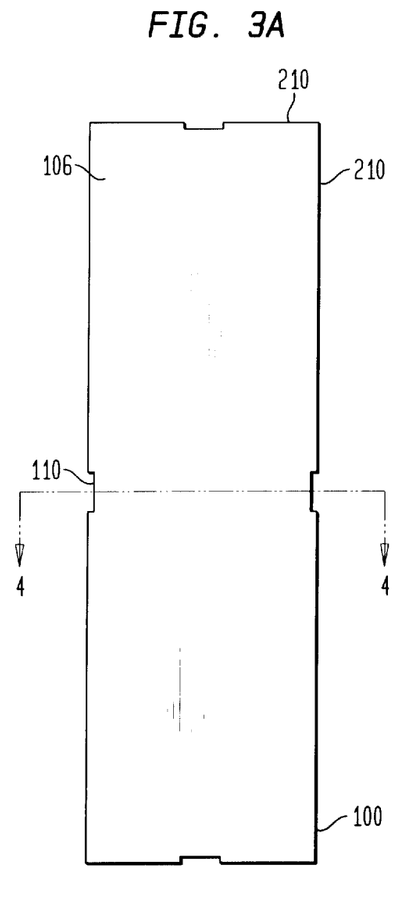
FIG. 3a is a top view illustrating one embodiment of an RF shield cover with internal fingers in accordance with the invention.
Figure 3B:
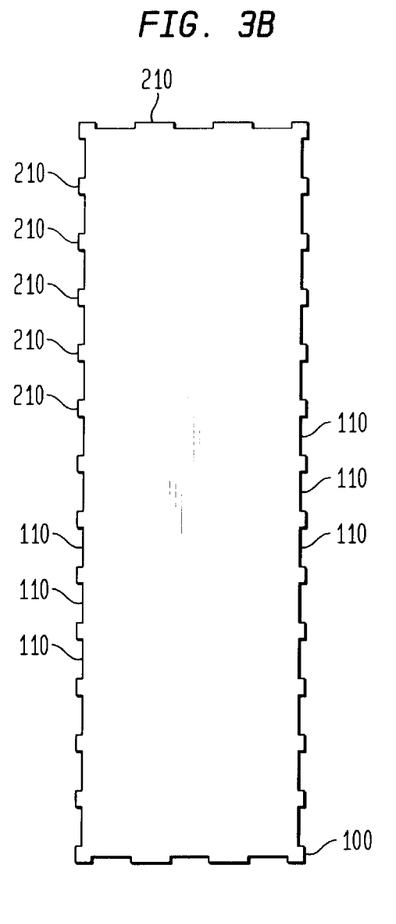
FIG. 3b is a top view illustrating a second embodiment of an RF shield cover with internal fingers in accordance with the invention.
Figure 3C:
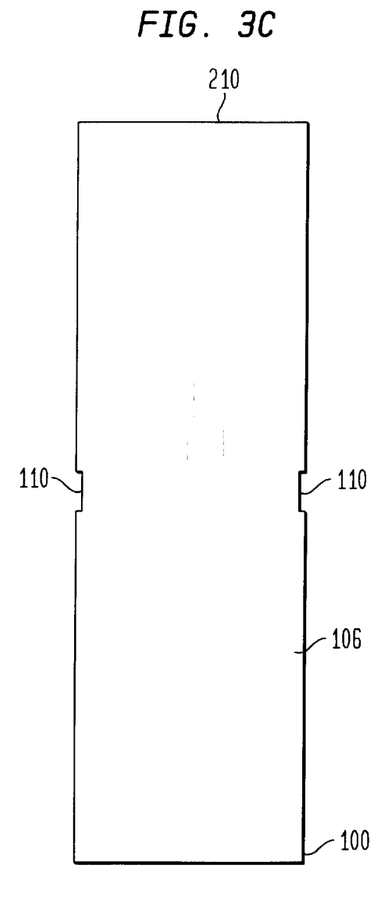
FIG. 3c is a top view illustrating another embodiment of an RF shield cover with internal fingers in accordance with the invention.

Referring to FIG. 3a, there is depicted a top view of an exemplary embodiment of the RF cover 100. In this embodiment, there is illustrated a single internal finger 110 on each edge of cover 102. However, the number of internal fingers is not limited to that number illustrated. Rather the number of fingers can be any number and is typically determined by the dimensions of the enclosure. In general, the longer the dimension of the enclosure, the greater number of fingers that will be employed. FIG. 3b illustrates a second embodiment of the invention in which includes a plurality of internal fingers 110

Figure 4:
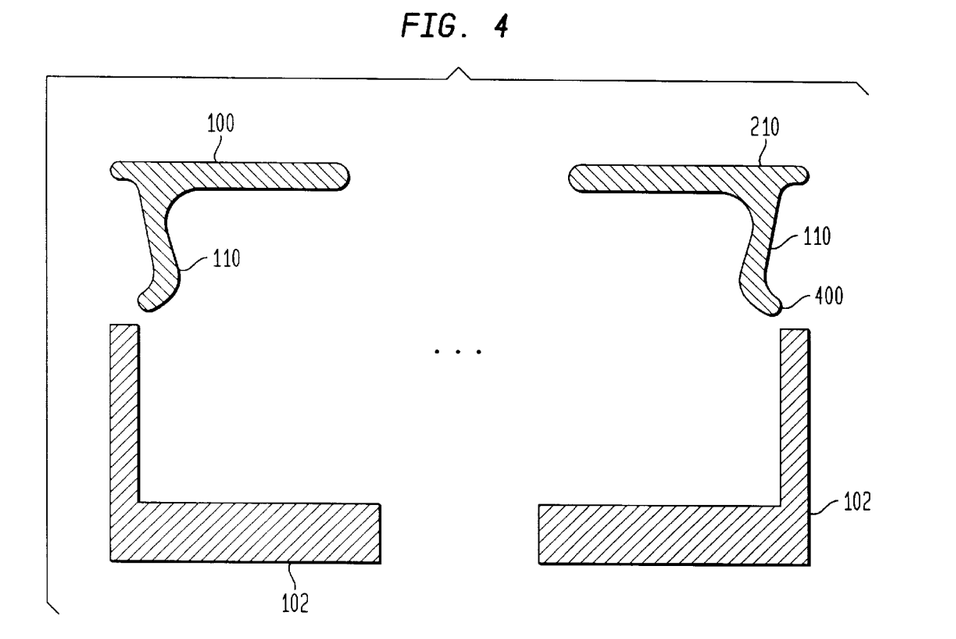
FIG. 4 is a side view through the cross-sectional line A—A of FIG. 3a illustrating an exemplary embodiment of a RF shield cover with internal fingers in accordance with the invention in which the RF shield cover is vertically displaced above the RF shield fence.
Figure 5:
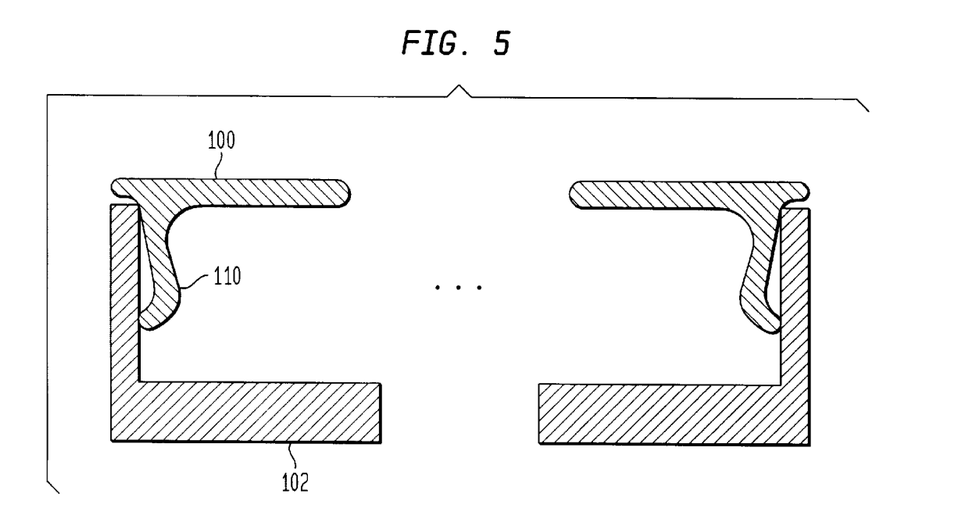
FIG. 5 is a side view through the cross-sectional line A—A of FIG. 3a illustrating an exemplary embodiment of a RF shield cover with internal fingers in accordance with the invention in which the RF shield cover engages the RF shield fence.

Referring to FIG. 4 and FIG. 5, there are shown cross sections of an exemplary embodiment of the RF shield cover 100 along the line A—A of FIG. 3a. FIG. 4 illustrates RF shield cover 100 above, and disengaged from, RF shield fence 102, similar to the configuration illustrated in FIG. 1. FIG. 5 illustrates RF shield cover 100 engaging the RF shield fence 102, similar to that illustrated in FIG. 2.

Referring to FIG. 4, it can be seen that fingers 110 extend downwardly from the top plate 106 of cover 100 and are directed inwardly toward the fence 102. A slight compressive force is required to insert finger 110 into perpendicular alignment with the edges of cover 100 and fence 102. This slight compressive force causes finger 110 to fit within the enclosure surrounded by fence 102. In a spring-like response to the slight compressive force, finger 110 generates a tensional force that is exerted against fence 102. These tensional forces hold cover 100 in contact with fence 102 without any adhesives such as solder or paste.

The unique shape of finger 110 serves to concentrate the tensional force upon fence 102 along a single engagement band 400. The finger shape, extending downwardly from top plate 106, is first directed away from RF fence 102, and then directed toward fence 102. This shape creates, along the width of finger 110, a band 400 at the free edge of finger 110, as illustrated in FIG. 4. With this shape, fingers 110 contact fence 102 continuously along band 400. Tensional forces generated by each finger are concentrated along band 400 and maintain continuous electrically contact between cover 100 and fence 102.

FIG. 5 illustrates the engagement of cover 100 whereby finger 110 pushes against shield fence 102 to hold cover 100 in place. As illustrated, finger 110 engages and applies a tensional force, on the inner surface of fence 102, at band 400. Tab 210, resting on edge 510 of RF fence 102 limits the depth that cover 100 extends into the enclosure and presents fence 102 from falling into the enclosure. Cover 100 is retained in position against RF shield fence 102 and is easily removed without the use of special tools.

In addition to concentrating the tensional force against fence 102, the plurality of bands from each at least one finger 110 forms a continues belt of contact along the entire inner length of RF shield fence 102. This belt of contact, in cooperation with tabs 210, provides a continuous metal-to-metal electrical seal between fence 102 and cover 100 that inhibits RF emissions from escaping from, or entering into, the covered enclosure.

Figure 6:
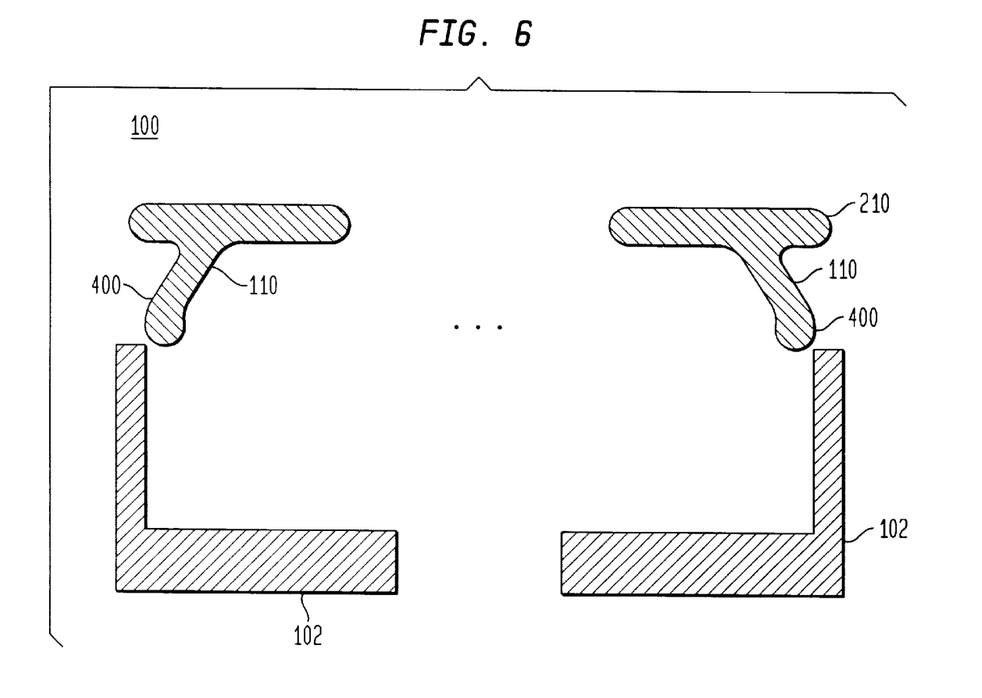
FIG. 6 is a side view through the cross-sectional line A—A of FIG. 3a illustrating another exemplary embodiment of a RF shield cover with internal fingers in accordance with the invention in which the RF shield cover is vertically displaced above the RF shield fence.
Figure 7:
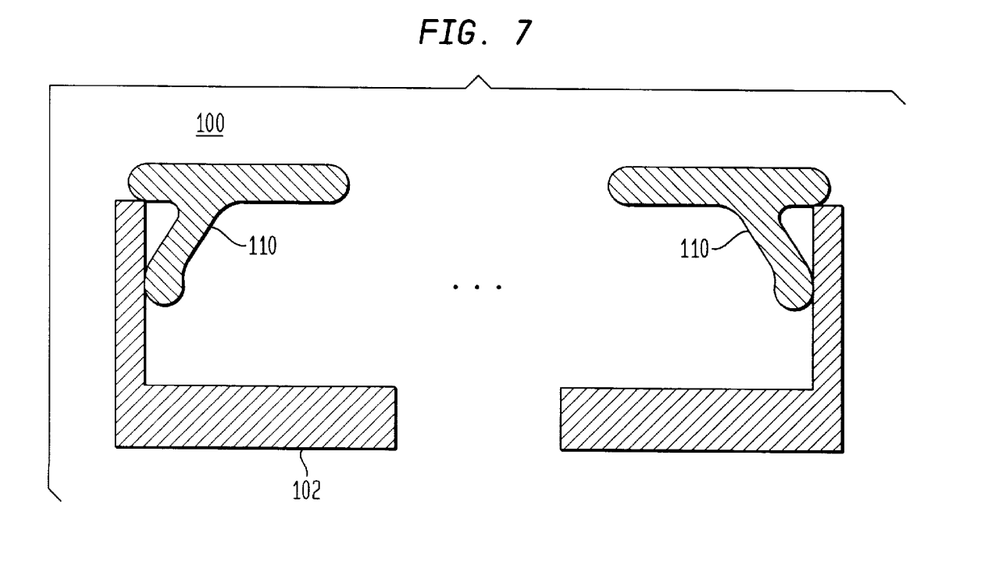
FIG. 7 is a side view through the cross-sectional line A—A of FIG. 3a illustrating an another exemplary embodiment of a RF shield cover with internal fingers in accordance with the invention in which the RF shield cover engages the RF shield fence.
Figure 8:
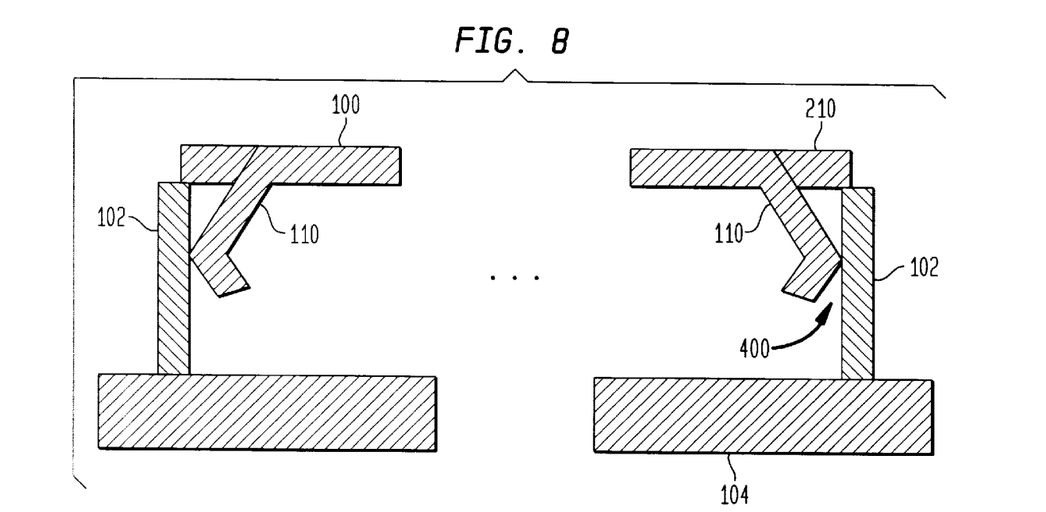
FIG. 8 is a side view through the cross-sectional line A—A of FIG. 3a illustrating another exemplary embodiment of a RF shield cover with internal fingers in accordance with the invention in which the RF shield cover engages the RF shield fence.

FIGS. 6 and 7 depict another embodiment of the invention with a different profile shape of finger 110. In this embodiment, finger 110 extends downwardly toward fence 102 and then extends away from fence 102. Similar to the shape illustrated in FIGS. 4 and 5, a band 600 is formed along each finger at which the tensional forces of fingers 110 are exerted against fence 102. FIG. 8 depicts still another embodiment of the invention with another profile shape of finger 110. In this embodiment, the extension away from fence 102 is more pronounced.

In addition to the ease of removal, a further advantage of the invention claimed is that the separation distance between RF fences may be reduced because cover 100 is contained completely within the enclosed area surrounded by fence 110. Typically, RF shield covers extend beyond the shield fence and, as discussed previously, attach to the outer surface of the fence. To prevent contact between adjacent covers, the separation distance between the RF shield fences is made sufficiently large to prevent adjacent covers from contacting one another. Contact between RF shield covers is avoided as such contact may introduce interference within the enclosed RF shield from a mis-match in respective ground planes. An RF shield cover that fits within the RF shield fence, made in accordance with the method of the invention, does not extend beyond the fence and are not capable of contacting an adjacent RF shield cover. As no compensation is necessary to prevent adjacent covers from touching, the separation distance between adjacent RF shield fences may be reduced. With the reduction in spacing between RF shield fences, the fences may be placed closer together and more space is available on the PWB for the placement of electrical components.

Experimentation with fence thickness of 0.024 inches and cover thickness ranging from 0.015 to 0.020 inches have been shown to provide easily removable shield covers, with fingers flexible enough to engage the RF fence and to suppress RF emissions from RF emanating circuitry within the enclosure.

Figure 9:
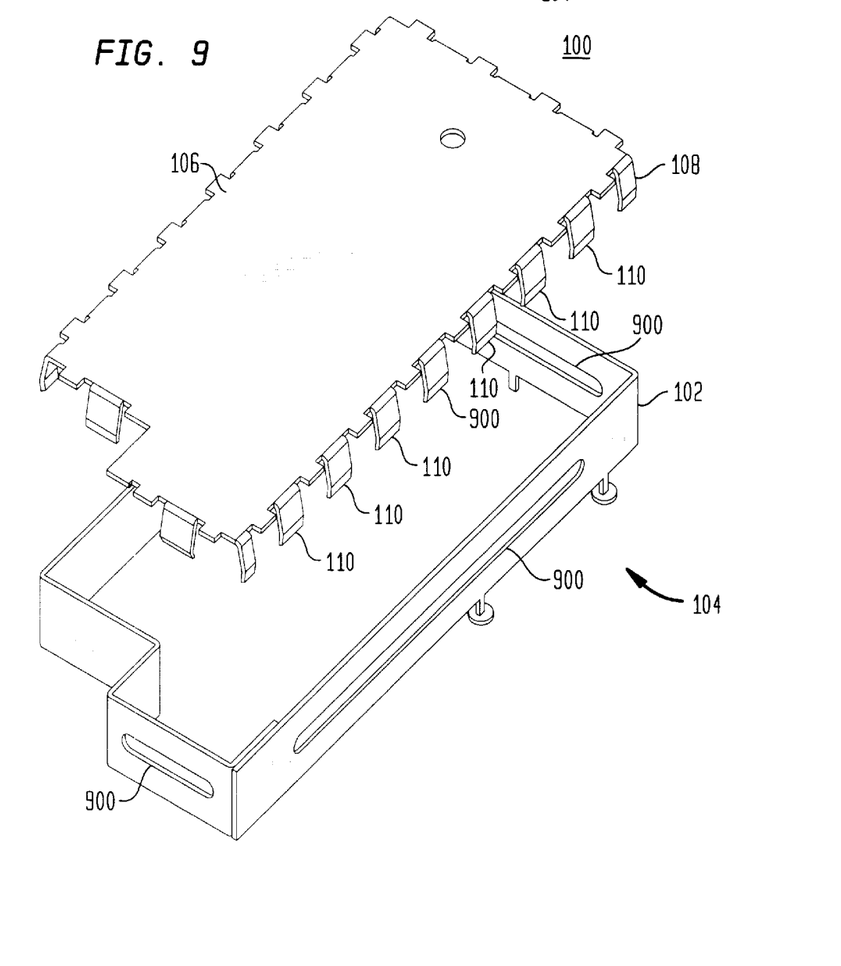
FIG. 9 is a perspective view illustrating an exemplary embodiment of an RF shield can cover with internal fingers in accordance with the invention in which the RF shield cover is vertically displaced from an RF shield fence that is ribbed.

In another embodiment of the invention, RF shield fences may contain indentations, such as continuous ribs or individual dimples, to improve the contact between the surfaces of the RF shield cover fingers 110 and the RF shield fence 102. FIG. 9 illustrates one embodiment of RF fence ribs 900 longitudinally inserted in the vertical walls of RF shield fence 102. In this exemplary embodiment the internal fingers 110 engage the protruding surface of rib 900 to increase the tensional force finger 110 exerts upon RF shield fence 102.

Figure 10:
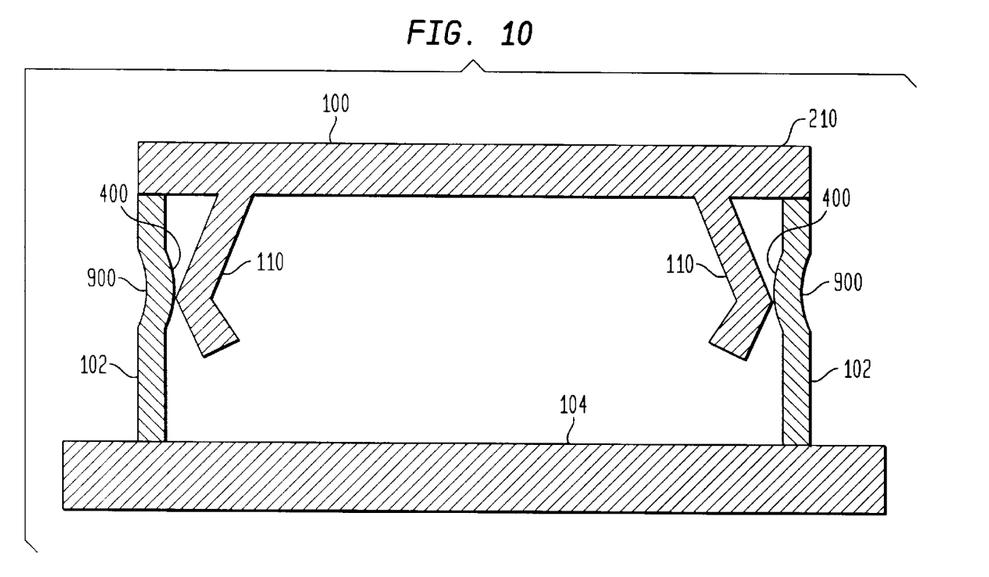
FIG. 10 is a side view through the cross-sectional line A—A of FIG. 3a illustrating another exemplary embodiment of an RF shield cover with internal fingers in accordance with the invention in which the RF shield cover engages the ribbed surface of an RF shield fence.

Referring to FIG. 10, there is depicted an exemplary embodiment of the RF shield cover 100 where the RF shield cover 100 is installed upon RF shield fence 102. In this position, the finger 110 securely pushes against the protruding inner surface of RF shield fence 102 created by rib 900. In this embodiment, finger 110 exerts a greater tensional force on RF shield fence 102 to retain RF shield cover 100 in place. RF shield cover 100 remains in continuous engagement with RF shield fence 102 at ribs 900 and provides additional surface area to which internal fingers 110 contact, thus improving the electrical contact between cover and shield.

Figure 11:
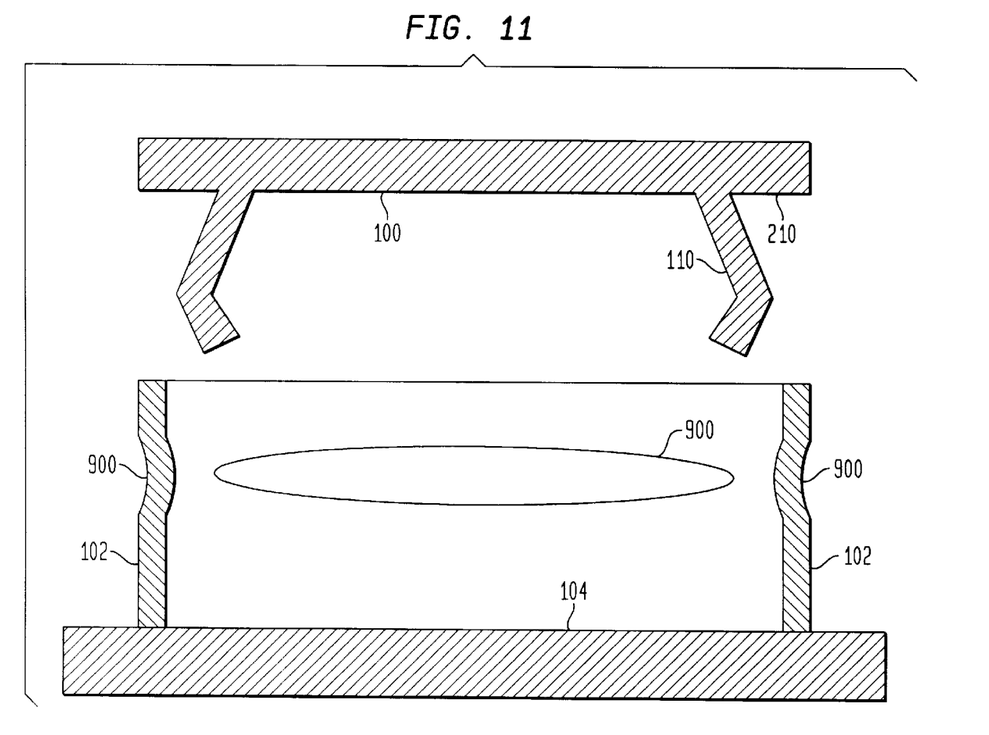
FIG. 11 is a side view through the cross-sectional line A—A of FIG. 3a illustrating a ribbed surface of an RF shield fence.
Figure 12:
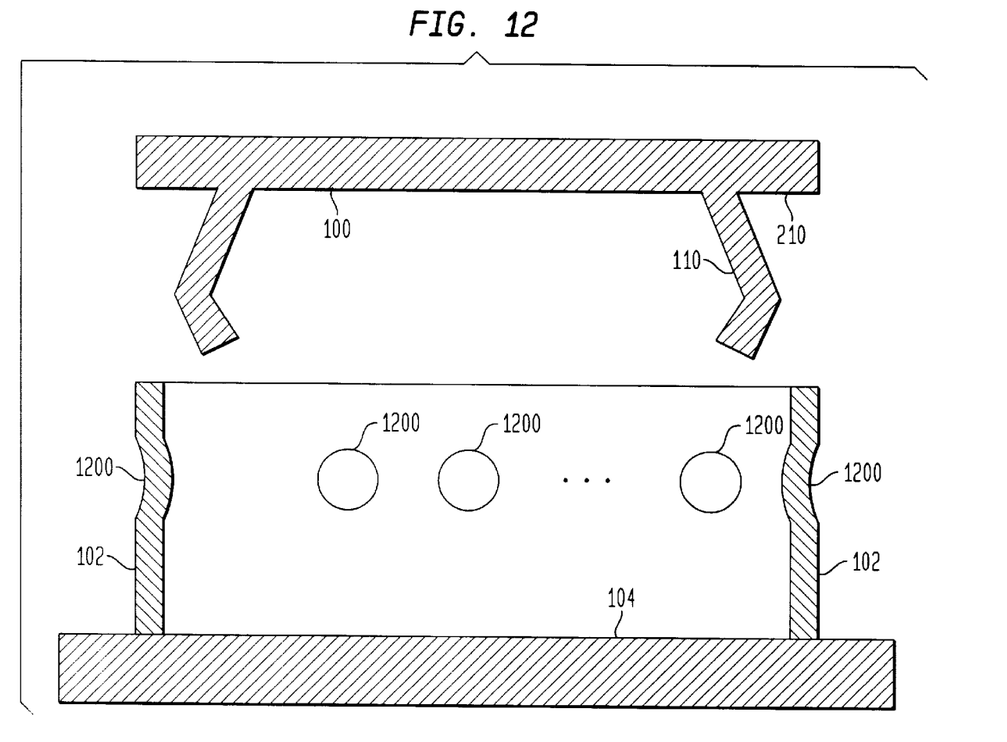
FIG. 12 is a side view through the cross-sectional line A—A of FIG. 3a illustrating dimpled surface of an RF shield fence.

FIG. 11 illustrates one embodiment of the ribbed shield fence wherein rib 900 is positioned horizontally and continuously along a vertical wall. In this illustration, rib 900 is positioned along a rear vertical wall of RF shield fence 102. In another embodiment, illustrated in FIG. 12, the vertical wall of RF shield fence is dimpled at known locations horizontally along the vertical wall of RF fence 102. In this embodiment, fingers 110 engage the protruding surfaces of dimples 1200.

A novel method for attaching RF shield covers to RF shield fences is disclosed that provides for the suppression of emissions from enclosed RF components while simplifying the attachment and removal of an RF shield cover when it is necessary to operate upon the components within the RF shield enclosure.

Conductive materials suitable for use in fabricating the claimed invention include such metals as copper, aluminum, phosper bronze, BeCu, and stainless steel, which are presented here only as illustrative examples. It would be apparent to those skilled in the art to substitute any one conductive metal for another and therefore a listing of all-possible metal types and alloys is not presented herein.

Numerous modifications and alternative embodiments of the claimed invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather that limitation, and that details of the structure may be varied substantially without departing from the spirit of the invention and the exclusive use of all modifications which come within the scope of the appended claims is reserved.

What is claimed is:

1. A radio frequency (RF) shield cover which attaches to a corresponding RF shield fence having a substantially vertical wall having an interior surface and a top edge, said RF shield cover comprising:

a top surface of conductive material for covering a top opening defined by said RF shield fence, said top surface having a peripheral edge and having at least one stop tab along said peripheral edge;

a plurality of conductive material walls coupled to said top surface at said peripheral edge, said plurality of walls being substantially perpendicular and protruding downward from said top surface;

at least one of said plurality of walls having engagement means comprising at least one engagement finger, said at least one engagement finger exerting tensional forces on said RF fence, wherein said at least one engagement finger is shaped to contact said RF shield fence at a band along the width of said at least one engagement finger, wherein said at least one engagement finger is formed by directing each said engagement finger away from said RF shield fence and then toward said RF shield fence wherein said band is located at a free edge of said at least one engagement finger wherein said engagement means detachably engages said interior surface of said vertical wall.

2. The RF shield cover as recited in claim 1, wherein said at least one stop tab located on said top surface engages said RF fence top edge.

3. The RF shield cover as recited in claim 2, wherein said at least one engagement finger is laterally positioned with respect to said at least one stop tab.

4. The RF shield cover as recited in claim 3 wherein said lateral position of said at least one stop tab and said at least one engagement finger continuously alternates between said at least one engagement finger and said at least one stop tab.

5. The RF shield cover as recited in claim 2 wherein the number of engagement fingers is greater than the number of tabs.

6. The RF shield cover as recited in claim 2 wherein the number of engagement fingers is less than the number of tabs.

7. The RF shield cover as recited in claim 2, wherein the number of engagement fingers is same as the number of tabs.

8. The RF shield cover as recited in claim 1 wherein said RF fence vertical wall contains indentations protruding into an area defined by said RF shield fence.

9. The RF shield cover as recited in claim 8, wherein said vertical wall indentations are continuous and horizontally positioned within said vertical wall.

10. The RF shield cover as recited in claim 8, wherein said vertical wall indentations are dimples positioned horizontally within said vertical wall.

11. A radio frequency (RF) shield, forming an enclosure surrounding electronic components that are attached to a printed circuit board, comprising:
an RF shield fence, said RF shield fence having a substantially vertical wall having an interior surface and a top edge, the walls of said fence being substantially perpendicular to said printed circuit board;
an RF cover detachably engaging said RF shield fence, said RF cover having a top surface of conductive material having a peripheral edge for covering a top opening defined by said RF shield fence, a plurality of conductive material walls coupled to said top surface at said peripheral edge, said plurality of walls being substantially perpendicular and protruding downward from said top surface, at least one of said plurality of walls having engagement means exerting tensional forces upon said RF fence, wherein said engagement means further comprises at least one engagement finger, wherein said at least one engagement finger is shaped to contact said RF shield fence at a band along the width of said at least one engagement finger, wherein said finger band is formed by directing each said engagement finger away from said RF shield fence and then toward said RF shield fence wherein said band is located at a free edge of said at least one engagement finger.

12. The RF shield as recited in claim 11 wherein said top surface has at least one stop tab along said peripheral edge.

13. The RF shield as recited in claim 12, wherein said at least one engagement finger is laterally positioned with respect to said at least one stop tab.

14. The RF shield as recited in claim 13 wherein said at least one engagement finger is located laterally with respect to said at least one tab and said positions of said at least one engagement finger and said at least one tab continuously alternate between said engagement finger and said tab.

15. The RF shield as recited in claim 14 wherein the number of engagement fingers is greater than the number of tabs.

16. The RF shield as recited in claim 14 wherein the number of engagement fingers is less than the number of tabs.

17. The RF shield as recited in claim 14 wherein the number of engagement fingers is the same as the number of tabs.

18. The RF shield as recited in claim 11 wherein said RF fence vertical wall contains indentations protruding into an area defined by said RF shield fence.

19. The RF shield as recited in claim 18, wherein said vertical wall indentations are continuous and horizontally positioned within said vertical wall.

20. The RF shield as recited in claim 18, wherein said vertical wall indentations are dimples positioned horizontally within said vertical wall.

* * * * *